INVENTOR.
NORMAN H. DITRICK

BY W. S. Hill

AGENT

Aug. 1, 1967 N. H. DITRICK 3,334,281

STABILIZING COATINGS FOR SEMICONDUCTOR DEVICES

Filed July 9, 1964

3 Sheets-Sheet 2

INVENTOR.
NORMAN H. DITRICK

BY

W. S. Hill

AGENT

INVENTOR.
NORMAN H. DITRICK
BY
W.S. Hill
AGENT 3,334,281

STABILIZING COATINGS FOR SEMICONDUCTOR DEVICES

Norman H. Ditrick, Raritan, N.J., assignor to Radio Corporation of America, a corporation of Delaware Filed July 9, 1964, Ser. No. 381,501
16 Claims. (Cl. 317—235)

This invention relates to improved semiconductive devices, and to improved methods of fabricating them. More particularly, the invention relates to improved insulated-gate field-effect semiconductor devices.

The type of semiconductor device in which the conductivity of a portion of a semiconductive wafer may be modulated by an applied electric field is known as a field-effect device. One kind of field-effect device has a dielectric or insulating layer over a portion of the surface of a crystalline semiconductive wafer, and has a control electrode deposited on this insulating layer. Units of this kind are known as insulated-gate field-effect devices, and may comprise a layer or wafer of crystalline semiconductive material, two spaced conductive regions adjacent to one face of said layer, a film of insulating material on said one face between said two spaced regions, two metallic electrodes bonded respectively to said two spaced conductive regions, and a metallic control electrode on said insulating film between said two spaced regions.

One class of insulated gate device is known as the MOS (Metal-Oxide Semiconductor) transistor, and is described by S. R. Hofstein and F. P. Heiman in "The Silicon Insulated-Gate Field-Effect Transistor," Proc. IEEE vol. 51, page 1190, September 1963. In devices of this type, the insulator usually consists of silicon oxide, the metallic control electrode on the insulating film is also known as the gate electrode, and the two electrodes bonded directly to the semiconductive wafer are known as the source and drain electrodes. It is desirable to improve the stability and uniformity of the electrical characterstics of such MOS devices.

It is an object of this invention to provide improved methods of fabricating improved semiconductor devices.

Another object of the invention is to provide improved methods of fabricating improved field-effect devices.

A further object is to provide improved field-effect devices.

An additional object is to provide improved field-effect devices having improved stability with respect to their electrical characteristics.

These and other objects of the invention are accomplished by providing a semiconductor device comprising a crystalline semiconductive substrate or body having at least one major face, and preferably having a resistivity of at least one ohm-cm.; first and second spaced low resistivity regions in said substrate immediately adjacent to said major substrate face; a first metallic contact on said substrate face over said first low resistivity region; a second metallic contact on said substrate face over said second low-resistivity region; a layer of dielectric material on said face covering the gap or space between said first and second regions, said dielectric layer being heavily doped with a substance which is a conductivity modifier in said substrate; and a metallic contact on said dielectric layer over the gap between said first and second regions.

The invention and its features will be described in greater detail by the following examples, considered in conjunction with the accompanying drawing, in which.

EXAMPLE I

Figures 1, 2, 3, 4:
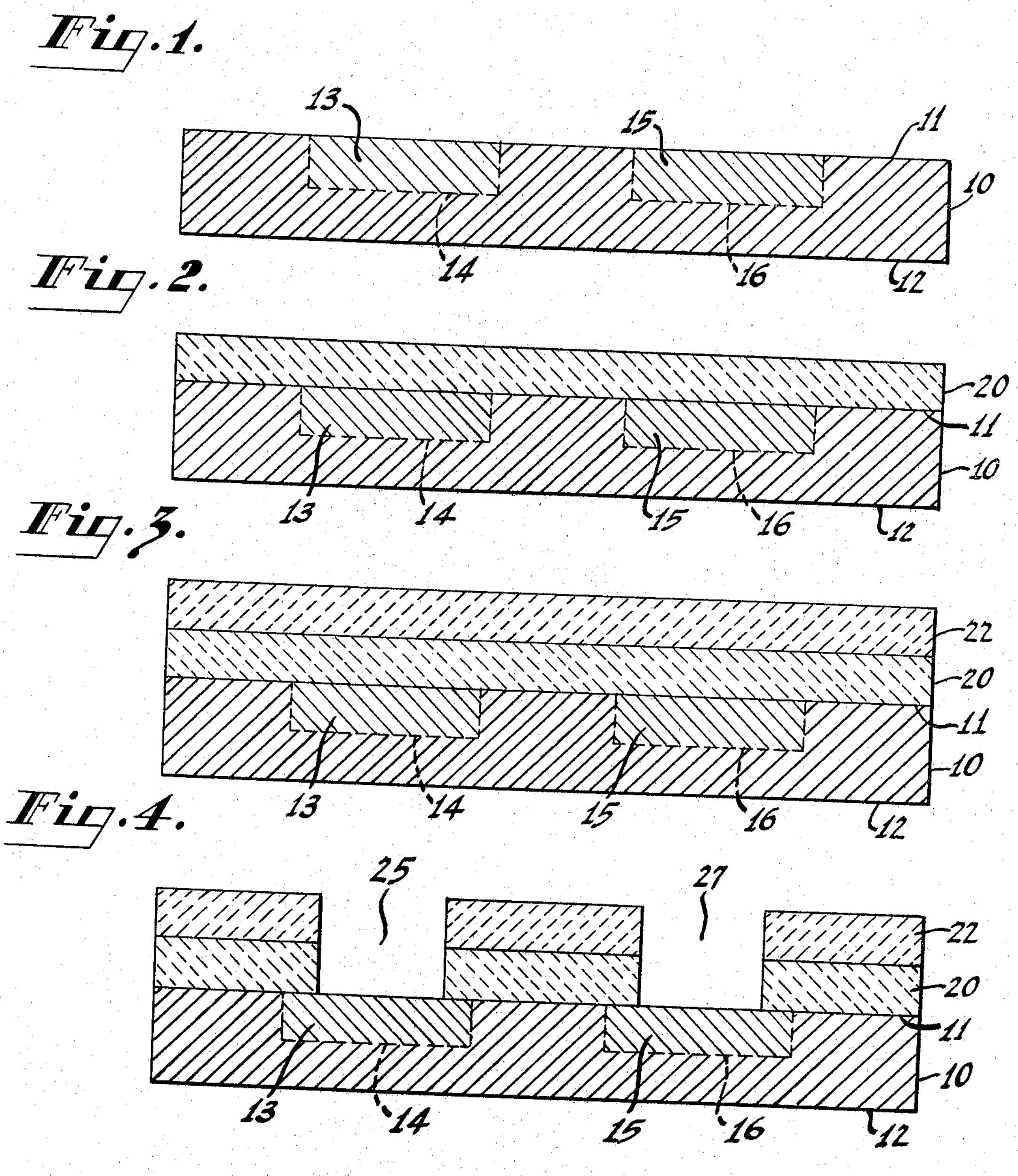
FIGURES 1–5 are cross-sectional elevational views of a semiconductive body illustrating successive steps in the fabrication of a semiconductor device according to one embodiment of the invention.

A crystalline semiconductive body 10 (FIGURE 1) is prepared with at least one major face 11. The exact size, shape and conductivity of semiconductive body 10 is not critical. Conveniently, the semiconductive body or substrate 10 is a die having two opposing major faces 11 and 12. In this example, the semiconductive die 10 is about 50 mils square, about 6 mils thick, consists of monocrystalline silicon, and is of P-type conductivity. The resistivity of die 10 is preferably at least 1 ohm-cm., that is, equal to or greater than 1 ohm-cm. Immediately adjacent one major die face 11 two spaced low resistivity regions 13 and 15 are formed. Formation of low resisitivity regions 13 and 15 may be accomplished by techniques known to the art, such as by diffusion of a conductivity modifier through a mask into selected portions of die face 11, and need not be described here. In this example, the two spaced low-resistivity regions 13 and 15 are formed by diffusion of a donor such as arsenic, antimony, phosphorus, or the like. To insure low resistivity in regions 13 and 15, the diffusion is accomplished under such conditions of source concentration and heating profile that the concentration of charge carriers (electrons in this example) at the surface of regions 13 and 15 is at least $10^{19}$ per $cm.^3$. This concentration decreases with increasing depth, but regions 13 and 15 are less than 0.5 mil thick. PN junctions 14 and 16 are formed at the boundaries between the N-type diffused regions 13 and 15 respectively and the P-type bulk of the wafer. The precise size and shape of the two diffused regions is not critical. The two regions 13 and 15 may be of the same size and shape, or may differ in this respect, but preferably the space between the two regions should be less than one mil. In this example, the two donor-diffused low resisitivity regions 13 and 15 are 10 mils long, 3 mils wide, and 0.1 mil thick. The two regions 13 and 15 are separated along their 10 mil length by a gap or space of about 0.2 mil.

A first layer 20 (FIGURE 2) of substantially pure or undoped silicon oxide is formed on the one major face 11 of die 10. Silicon oxide layer 20 may be formed by thermal decomposition of a siloxane compound, as described below. Alternatively, where the die 10 consists of silicon, the silicon oxide layer 20 may be formed by thermal oxidation of the die. In this example, silicon die 10 is heated in an oxygen ambient for about 7–12 minutes at a temperature of about 1050° C. The first silicon oxide layer 20 thus formed is about 250 to 300 Angstroms thick, and consists of substantially pure or undoped silicon oxide. The undoped layer 20 acts as a barrier to prevent diffusion into the semiconductive die of conductivity modifiers from the doped silicon oxide layer which is deposited next. Heavily doped silicon oxide does not adhere to a silicon surface as well as pure or undoped silicon oxide. However, heavily doped silicon oxide does adhere well to undoped silicon oxide. Therefore, the undoped silicon oxide layer 20 also serves as a firm base to insure the adherence of the doped silicon oxide layer which is next deposited.

Referring now to FIGURE 3, a second silicon oxide layer 22 is deposited on the first silicon oxide layer 20. The second silicon oxide layer 22 is formed by the thermal decomposition of a siloxane compound as described below, and is heavily doped with a substance that is a conductivity modifier in semiconductive body 10, that is, contains at least one-half percent by weight of the conductivity modifier. In this example, the conductivity modifier is phosphorus. The silicon oxide layer 22 may contain as much as 10 to 30 percent phosphorus by weight, usually in the form of $P_2O_5$. The doped silicon oxide layer 22 is conveniently about 300 to 350 Angstroms thick. In the drawing, the thickness of the silicon oxide layers is not to scale, having been exaggerated for greater clarity.

Two spaced openings or apertures 25 and 27 (FIGURE 4) are now formed in the silicon oxide coatings 20 and 22 by any convenient method. For example, portions of the surface of the silicon oxide layer may be masked by coating with an acid resist. Portions of the silicon oxide layers over the low resistivity regions 13 and 15 are then removed by conventional etching processes well known to the art, leaving openings 25 and 27. One opening 25 is formed entirely within one low-resistivity region 13, and the other opening 27 is formed entirely within the other low resistivity wafer region 15. If an acid resist has been utilized, it is removed by means of a suitable solvent prior to the next step.

Figure 5:
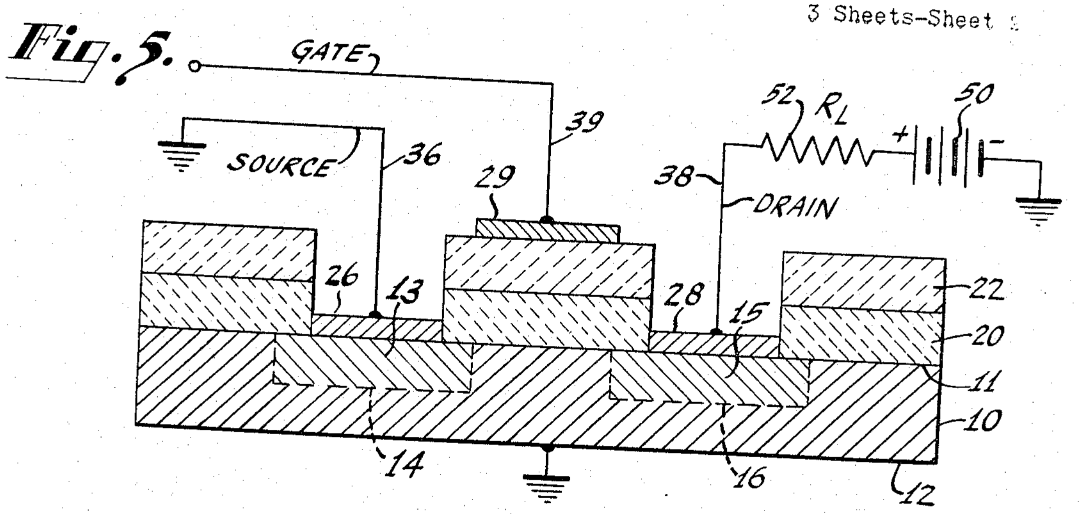

Referring now to FIGURE 5, a metal such as aluminum, palladium, chromium, or the like is deposited by any convenient method, for example, by evaporation through a mask, on the exposed portions of wafer regions 13 and 15, and also on a portion of the uppermost silicon oxide layer 22 over the gap or space between regions 13 and 15. One metallic contact 26 is thus formed to region 13, another metallic contact 28 to region 15, and a third metallic contact 29 on the uppermost silicon oxide layer 22 over the gap between regions 13 and 15. In operation, contacts 26 and 28 serve as the source and drain electrodes, while contact 29 serves as the control or gate electrode of the device. Electrical leads 36, 38 and 39 may be attached to electrodes 26, 28 and 29 respectively. Conveniently, lead wires 36, 38 and 39 are gold wires attached to the electrodes 26, 28 and 29 by thermocompression bonding. In operation, the unit may be biased as shown. The unit may be encapsulated and cased by standard techniques known to the semiconductor art.

The device of this example may be operated as follows. Leads 36 and 38 are utilized as the source and drain leads, respectively, while lead 39 is the control or gate lead. Die face 12 and source lead 36 are grounded. Drain lead 38 is positively biased by a source of direct current potential such as a battery 50, so that the drain electrode or contact 28 and the drain region 15 of the device are also poled positive with respect to the source region 13 and the source electrode 26. The electrical load, shown as a resistance 52, is connected between the positive pole of battery 50 and the drain lead 38. A signal input on gate lead 29 results in an amplified signal output developed across the load resistor 52.

One method of depositing a dielectric or insulating coating on a semiconductive wafer or die is to treat the wafer in the vapors of an organic siloxane compound at a temperature below the melting point of the wafer, but above the temperature at which the siloxane compound decomposes, so that an adherent insulating coating believed to consist principally of silicon dioxide is formed on the wafer surface. For example, see U.S. Patent 3,089,793, issued May 14, 1963 to Jordan and Donahue, and assigned to the assignee of this application.

A method of applying a doped silicon oxide coating to a semiconductive body, and apparatus useful for this purpose, will now be described.

*Description of apparatus*

Figures 8, 9:
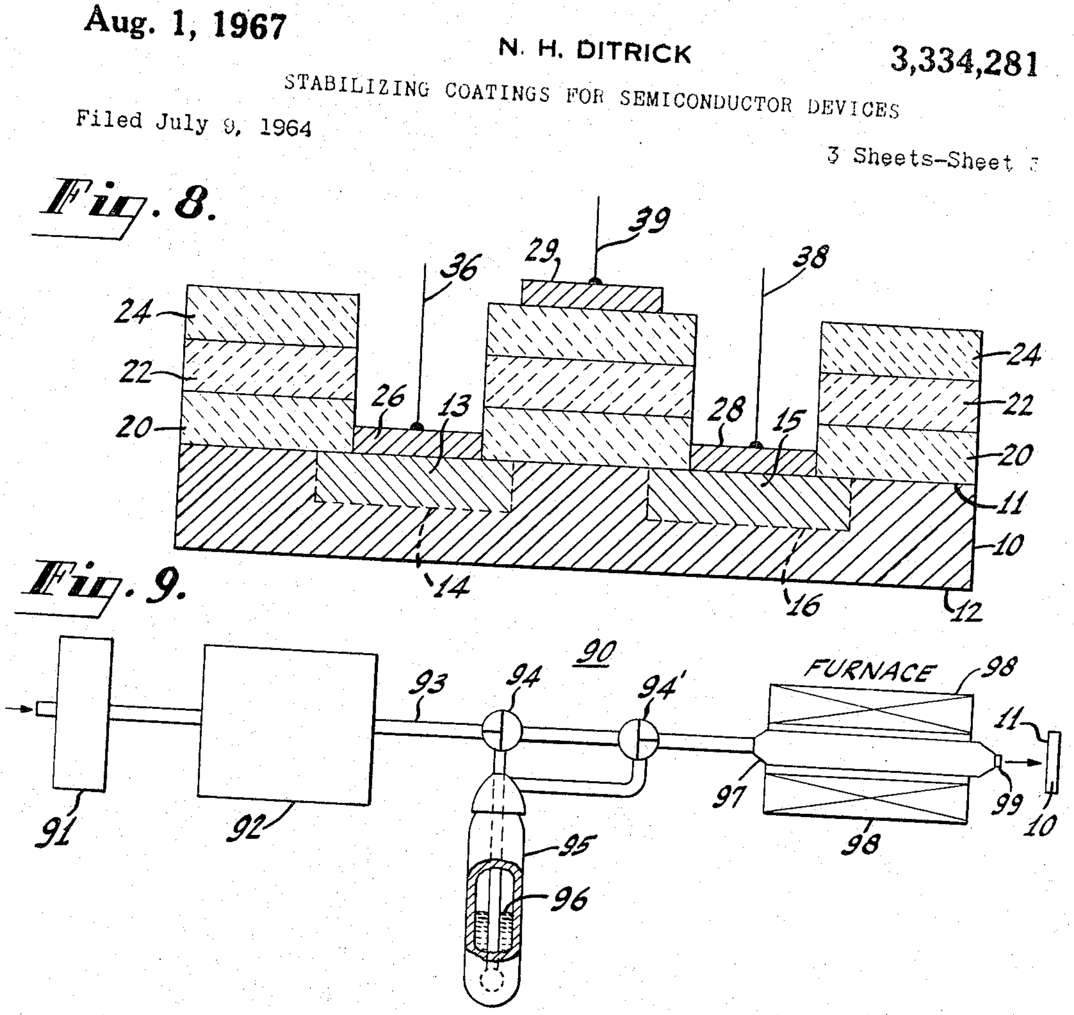
FIGURE 9 is a schematic diagram of one form of apparatus useful in the practice of the invention; and, FIGURE 10 is a graph showing the variation of transconductance with time for a field-effect device as described, and for a comparable prior art device.

A form of apparatus useful in the practice of the invention is illustrated in FIGURE 9. The apparatus 90 comprises a flow meter 91 for regulating the flow of the carrier gas; a drier or drying column 92 for purification of the carrier gas utilized; and an inlet tube 93 provided with stopcocks 94 and 94' for bypassing a bubbler 95. The bubbler 95 contains a liquid mixture 96, which consists of an organic siloxane compound and a volatile doping agent or conductivity modifier for the particular semiconductor utilized. The organic siloxane compound may, for example, consist of 10 volumes of ethyl triethyoxysilane, and the volatile doping agent may be 1 volume of trimethyl phosphate. The proportions of the conductivity modifier and the siloxane compound may be varied to obtain different concentrations of the doping agent in the silicon oxide layers deposited. Inlet tube 93 is attached to one end of furnace tube 97. The apparatus 90 generally, including inlet tube 93 and furnace tube 97, are suitably made of refractory materials, such as high-melting glass, or fused quartz. The furnace tube 97 is surrounded by a furnace 98, which is maintained at about 700° C. An inert carrier gas such as nitrogen, argon, helium, and the like, is passed through the apparatus 90 in the direction indicated by the arrows. Since siloxane compounds generally begin to decompose at about 600° C., the furnace temperature of 700° C. is sufficient to insure pyrolysis of siloxane vapors introduced into the furnace tube 97 by the flowing carrier gas. The trimethyl phosphate is also decomposed at this temperature and is oxidized to phosphorus pentoxide $P_2O_5$.

The mixed vapors of the inert carrier gas, the doping agent, and the thermal decomposition products of the siloxane compound, which include silicon dioxide, exit from the other end of furnace tube 97 by way of jet 99, and the jet stream of mixed vapors and carrier gas (not shown) thus formed impinges upon one face 11 of the semiconductive die 10. A coating of phosphorus-doped silicon oxide is thus deposited on face 11 of die 10. The jet stream cools off rapidly as it leaves the jet 99, and hence the temperature of the jet stream at the point where it impinges on the semiconductive wafer may be varied by adjusting the distance between the jet or orifice 99 and the semiconductive die or wafer 10. For a furnace temperature of about 700° C., and a separation between jet 99 and semiconductive die 10 of about 2 millimeters, the temperature of the jet impinging on the semiconductive die is about 150° C. For a more detailed description, see U.S. Patent 3,114,663, issued Dec. 17, 1963, to J. Klerer, and assigned to the assignee of this application. It is thus seen that doped silicon oxide coatings can be deposited by this technique on semiconductive wafers while maintaining the semiconductor at very moderate temperatures. Undoped silicon oxide coatings can be similarly deposited by omitting the doping agent from the liquid 96 in bubbler 95.

EXAMPLE II

It may be desirable to fabricate devices according to the invention utilizing precision photolithographic processes. In these processes a thin layer of a photoresist is deposited on the uppermost oxide coating. The photoresist, may, for example, be a bichromated protein such as bichromated gum arabic, bichromated gelatin or bichromated albumin.

The photoresist layer may be deposited directly on an oxide layer containing a conductivity modifier, such as the phosphorus-doped silicon oxide layer 22 of Example I above. However, it has been found that the photoresist layer does not adhere to the phosphorus-doped silicon oxide as uniformly as a photoresist layer adheres on pure undoped silicon oxide. Accordingly, when utilizing photolithographic techniques, it has been found advantageous to deposit, as a third layer on the semiconductive die, a thin coating of pure undoped silicon oxide over the doped silicon oxide layer 22. The photoresist layer is then deposited on the surface of this pure silicon oxide layer, and adheres more uniformly thereto.

In this embodiment, a crystalline semiconductive die 10 having a resistivity of at least 1 ohm-cm. is prepared with opposing major faces 11 and 12, as in FIGURE 1, and two spaced low-resistivity regions 13 and 15 are formed adjacent one major face 11 by diffusion of a conductivity modifier into selected portions of die face 11. The low resistivity regions 13 and 15 may be of the same conductivity type as the bulk of the die. For example, the die 10 may be lightly N-type, containing about $10^{16}$ charge carriers (electrons) per cm.$^3$. The regions 13 and 15 are given a surface concentration of at least $10^{19}$ charge carriers per cm.$^3$. The boundaries 14 and 16 may then be described as N- N+ junctions. A first layer 20 (FIGURE 2) of pure or undoped silicon oxide is deposited on major die face 11. This first layer serves as a barrier to prevent diffusion of conductivity modifiers from the next silicon oxide layer into the semiconductive die. A second silicon oxide layer 22 (FIGURE 3) is deposited on the first silicon oxide layer 20. The second layer 22 is conveniently formed by the thermal decomposition of a siloxane compound, as described above in connection with FIGURE 9, and is heavily doped with a conductivity modifier, such as phosphorus.

Figure 6:
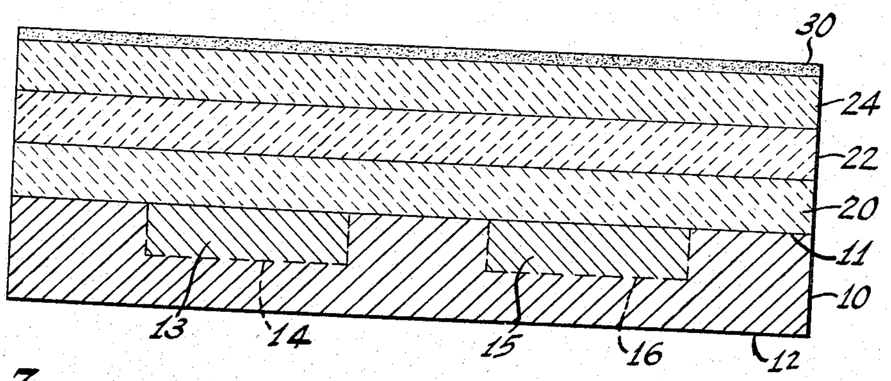
FIGURES 6–8 are cross-sectional elevational views of a semiconductive body illustrating successive steps in the fabrication of a semiconductor device according to another embodiment of the invention.

Referring now to FIGURE 6, a third silicon oxide coating 24 of pure or undoped silicon oxide is deposited on the second silicon oxide layer 22. Layer 24 is conveniently formed by thermal decomposition of a siloxane compound, as described above in connection with FIGURE 9. A pure siloxane compound, such as ethyltrioxy silane, or the like, is utilized as the liquid 96 in the bubbler 95, in order to deposit the pure or undoped silicon oxide layer 24.

A thin coating 30 (FIGURE 6) of a photoresist is deposited on the third silicon oxide layer 24. The photoresist utilized may be one of those previously mentioned, or may be a commercially available photoresist such as Eastman Kodak "KPR" and "KMER," or Clerkin Company "CFC," or Pitman Company "Hot Top."

Figure 7:
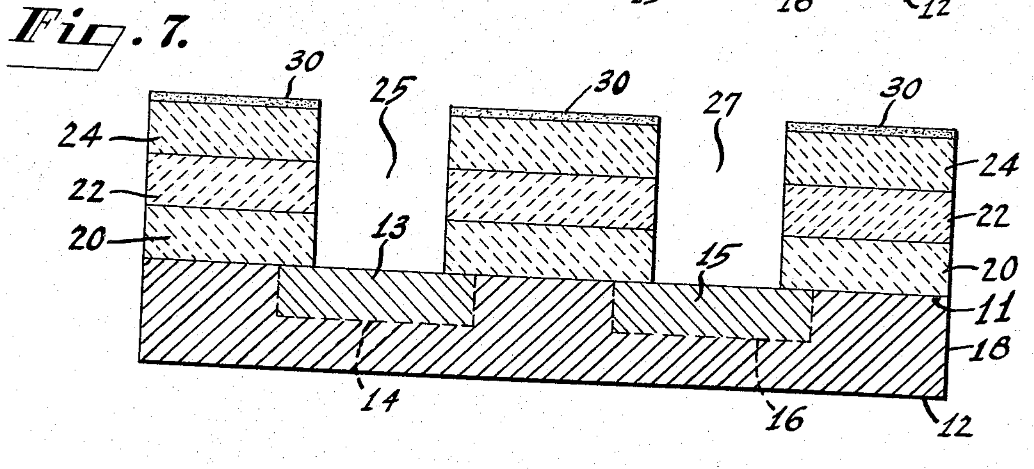

Portions of the photoresist layer 30 are illuminated by ultra-violet light, then polymerized, and hardened. The remaining portions of photoresist 30 are removed by a suitable solvent, thus exposing portions of the silicon oxide layer 24. A suitable etchant, such as a hydrofluoric acid solution, is then utilized to remove the exposed portions of silicon oxide layers 24, 22 and 20. Two spaced openings or apertures 25 and 27 (FIGURE 7) are thus formed in the silicon oxide coatings 24, 22 and 20. One opening 25 is formed entirely within one low resistivity region 13, and the other opening 27 is formed entirely within the other low-resistivity region 15.

The remaining portions of the photoresist layer 30 are removed by means of a suitable stripper, such as methylene chloride. A metal such as chromium, palladium, aluminum, and the like, is deposited by any convenient method, such as by evaporation, on the exposed portions of die regions 13 and 15, and also on a portion of the uppermost silicon oxide layer 24 over the gap or space between regions 13 and 15. A first metallic contact 26 (FIGURE 8) is thus formed to die region 13; a second metallic contact 28 is formed to die region 15; and a third metallic contact 29 is formed on the uppermost silicon oxide layer 24 over the gap or spaced between the regions 13 and 15. The subsequent steps of attaching lead wires 36, 38 and 39 to the metallic contacts 26, 28 and 29 respectively, then encapsulating and casing the device, are accomplished by standard techniques of the semiconductor art. The completed unit is biased and operated in the same manner as described in Example I above in connection with FIGURE 5.

Figure 10:
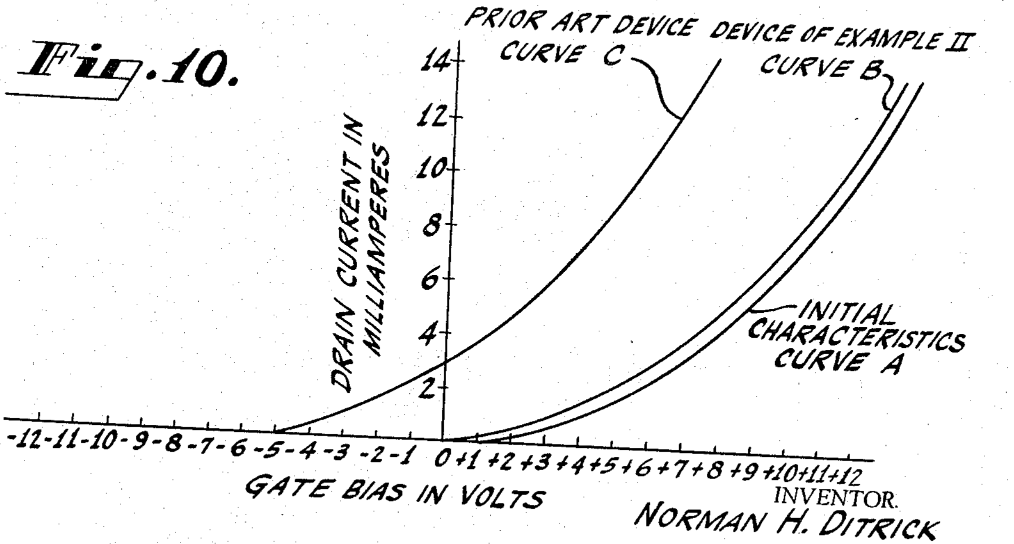

In FIGURE 10, curve A is a plot showing the drain current (in milliamperes) at different values of gate bias (in volts) for a typical insulated-gate field-effect device shortly after fabricating. When the gate bias is positive and is one volt or less, essentially no drain current flows. When such insulated-gate field-effect transistors are stored at elevated temperatures with a positive bias on the gate, their electrical characteristics, particularly, the transconductance or transfer characteristic, tends to change. Curve B is a plot showing the drain current (in milliamperes) at different values of gate bias (in volts) for an insulated-gate field-effect device according to Example II after 16 hours storage at 125° C. with a positive gate bias 10 volts applied during the entire storage period. This device included between the gate electrode and the semiconductive die a triple layer of silicon oxide, comprising a central layer heavily doped with phosphorus, between two layers of essentially pure or undoped silicon oxide. In that device according to Example II, the graph of which is drawn in FIGURE 10, there is only a small and tolerable change in the transfer characteristic. The positive gate bias at which the drain current becomes essentially zero is now 0.5 volt, and in general, curve B is shifted by about 0.5 volt from the corresponding values of these devices after fabrication and before storage, which were shown in curve A. For comparison, curve C shows the drain current (in milliamperes) at different values of gate bias (in volts) after storage for 16 hours at 125° C. with 10 volts positive gate bias for a prior art insulated-gate field-effect transistor having only pure or undoped silicon oxide between the gate electrode and the semiconductive die. In the prior art device, some drain current flows even at zero gate bias, and in general, curve C is shifted by about 5 volts from the corresponding values of the device before storage, as shown in curve A. A change in characteristics of this magnitude is undesirable for many circuit applications. It is thus seen that after storage at elevated temperatures the insulated-gate field-effect transistor according to the embodiment of Example II is more stable as to transfer characteristic than the corresponding prior art device by a factor of 10.

The exact reasons for the improved stability of insulated-gate field-effect semiconductor devices according to the invention are not presently understood. However, the invention may be practiced regardless of whatever theoretical explanation is subsequently selected to explain the results obtained.

The above examples are by way of illustration only, and not limitation. Other doping agents such as boron and arsenic may be utilized instead of phosphorus. Other dielectrics or insulators, such as magnesium oxide and the like, may be utilized instead of silicon oxide. The conductivity types of the various regions in the device may be reversed. Other siloxane compounds such as dimethyl diethoxysilane, tetraethoxysilane, amyl triethoxysilane, and vinyl triethoxysilane may be utilized. Other semiconductive materials such as germanium and silicon-germanium alloys may be used instead of silicon. Various other modifications may be made without departing from the spirit and scope of the invention as set forth in the specification and appended claims.

What is claimed is:

1. An insulated-gate field-effect semiconductor device comprising:

a high resistivity crystalline semiconductive body having at least one major face;

first and second spaced low resistivity regions in said body immediately adjacent said one major face;

a high resistivity-low resistivity junction between each of said spaced regions and said body;

metallic electrode contacts to said first and second regions;

a layer of dielectric material on said face covering the gap between said regions, said dielectric layer being heavily doped with a substance which is a conductivity modifier for said body; and, a metallic gate electrode on said dielectric layer over said gap between said regions.

2. An insulated-gate field-effect semiconductor device comprising:

a crystalline semiconductive body of given type conductivity having at least one major face;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a layer of dielectric material on said body face covering the gap between said first and second regions, said dielectric layer containing at least one-half percent by weight of a substance which is a conductivity modifier for said body; and, a metallic contact on said dielectric layer over the gap between said first and second regions.

3. An insulated-gate field-effect device comprising:

a crystalline silicon body of given type conductivity having at least one major face;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a layer of dielectric material on said body face covering the gap between said first and second regions, said dielectric layer being heavily doped with a substance which is a conductivity modifier for said body and, a metallic contact on said dielectric layer over the gap between said first and second regions.

4. An insulated-gate field-effect semiconductor device comprising:

a crystalline silicon body of given type conductivity having at least one major face, said die having a resistivity of at least 1 ohm-cm.;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a layer of dielectric material on said body face covering the gap between said first and second regions, said dielectric layer being heavily doped with a substance which is a conductivity modifier for said body; and, a metallic contact on said dielectric layer over the gap between said first and second regions.

5. An insulated-gate field-effect semiconductor device comprising:

a crystalline silicon body of given type conductivity having at least one major face, said body having a resistivity of at least 1 ohm-cm.;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a layer of dielectric material on said body face covering the gap between said first and second regions, said dielectric layer containing at least one-half percent by weight of phosphorus; and, a metallic contact on said dielectric layer over the gap between said first and second regions.

6. An insulated-gate field-effect semiconductor device comprising:

a crystalline silicon body of given type conductivity having at least one major face, said die having a resistivity of at least 1 ohm-cm.;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a layer of silicon oxide on said body face covering the gap between said first and second regions, said silicon oxide layer containing at least one-half percent by weight of phosphorus; and, a metallic contact on said silicon oxide layer over the gap between said first and second regions.

7. An insulated-gate field-effect semiconductor device comprising:

a crystalline semiconductive body of given type conductivity having at least one major face;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a first layer of undoped dielectric material on said body face covering the gap between said first and second regions;

a second layer of dielectric material on said first layer, said second layer being heavily doped with a substance which is a conductivity modifier for said body; and, a third metallic contact on said dielectric layer over the gap between said first and second regions.

8. An insulated-gate field-effect semiconductor device comprising:

a crystalline silicon body of given type conductivity having at least one major face;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a first layer of undoped dielectric material on said body face covering the gap between said first and second regions;

a second layer of dielectric material on said first layer, said second layer being heavily doped with a substance which is a conductivity modifier for said body; and, a third metallic contact on said dielectric layer over the the gap between said first and second regions.

9. An insulated-gate field-effect semiconductor device comprising:

a crystalline silicon body of given type conductivity having at least one major face, said body having a resistivity of at least 1 ohm-cm.;

first and second spaced low resistivity regions of opposite type conductivity in said body immediately adjacent said one major face;

a PN junction between each of said opposite type regions and said body;

a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second layer being heavily doped with a substance which is a conductivity modifier for said body; and,
a third metallic contact on said dielectric layer over the gap between said first and second regions.

10. An insulated-gate field-effect semiconductor drive comprising:
a crystalline silicon body of given type conductivity having at least one major face, said body having a resistivity of at least 1 ohm-cm.;
first and second spaced low resistivity regions of opposite type conductivity in said body immediately adjacent said one major face;
a PN junction between each of said opposite type regions and said body;
a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second dielectric layer containing at least one-half percent by weight of a substance which is a conductivity modifier for silicon; and,
a third metallic contact on said dielectric layer over the gap between said first and second regions.

11. An insulated-gate field-effect semiconduutor device comprising:
a crystalline silicon body of given type conductivity having at least one major face, said body having a resistivity of at least 1 ohm-cm.;
first and second spaced low resistivity regions of opposite type conductivity in said body immediately adjacent said one major face;
a PN junction between each of said opposite type regions and said body;
a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second layer of dielectric material containing at least one-half percent by weight phosphorus; and
a third metallic contact on said dielectric layer over the gap between said first and second regions.

12. An insulated-gate field-effect semiconductor device comprising:
a crystalline silicon body of given type conductivity having at least one major face, said body having a resistivity of at least 1 ohm-cm.;
first and second spaced low resistivity regions of opposite type conductivity in said body immediately adjacent said one major face;
a PN junction between each of said opposite type regions and said body;
a first metallic contact on said body face to said first low resistivity region;
a second metalic contact on said body face to said second low resistivity region;
a first layer of undoped silicon oxide on said body face covering the gap between said first and second regions;
a second layer of silicon oxide on said first layer, said second layer of silicon oxide containing at least one-half percent by weight phosphorous; and
a third metallic contact on said silicon oxide layer over the gap between said first and second regions.

13. An insulated-gate field-effect semiconductor device comprising:
a crystalline semiconductive body of given type conductivity having at least one major face;
first and second spaced low resistivity regions of opposite type conductivity in said body immediately adjacent said one major face;
a PN junction between each of said opposite type regions and said body;
a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second layer being heavily doped with a substance which is a conductivity modifier for said body;
a third layer of undoped dielectric material on said second layer; and,
a third metallic contact on said third dielectric layer over the gap between said first and second regions.

14. An insulated-gate field-effect semiconductor device comprising:
a crystalline silicon body of given type conductivity having at least one major face;
first and second spaced low resistivity regions of opposite type conductivity in said body immediately adjacent said one major face;
a PN junction between each of said opposite type regions and said body;
a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second layer containing at least one-half percent by weight of a substance which is a conductivity modifier for silicon;
a third layer of undoped dielectric material on said second layer; and,
a third metallic contact on said third dielectric layer over the gap between said first and second regions.

15. An insulated-gate field-effect semiconductor device comprising;
a crystalline silicon body of given type conductivity having at least one major face, said body having a resisitivity of at least 1 ohm-cm.;
first and second spaced low resistivity regions of opposite type conductivity in said body immediately adjacent said one major face;
a PN junction between each of said opposite type regions and said body;
a first metallic contact on said body face to said first low resistivity region;
a second metallic contact on said body face to said second low resistivity region;
a first layer of undoped dielectric material on said body face covering the gap between said first and second regions;
a second layer of dielectric material on said first layer, said second layor containing at least one-half percent by weight phosphorus;
a third layer of undoped dielectric material on said second layer; and, a third metallic contact on said third dielectric layer over the gap between said first and second regions.

16. An insulated-gate field-effect semiconductor device comprising:

a crystalline silicon body of a given type conductivity having at least one major face, said body having a resistivity of at least 1 ohm-cm.;

first and second spaced low resistivity regions of opposite type conductivity in said body immediately adjacent said one major face;

a PN junction between each of said opposite type regions and said body;

a first metallic contact on said body face to said first low resistivity region;

a second metallic contact on said body face to said second low resistivity region;

a first layer of undoped silicon oxide on said body face covering the gap between said first and second regions;

a second layer of silicon oxide on said first layer, said second layer containing at least one-half percent by weight phosphorous;

a third layer of undoped silicon oxide on said second layer; and, a third metallic contact on said silicon oxide layer over the gap between said first and second regions.

References Cited

UNITED STATES PATENTS

| | | | |
|---|---|---|---|
| 3,056,888 | 10/1962 | Atalla | 307—88.5 |
| 3,065,391 | 11/1962 | Hall | 317—234 |
| 3,102,230 | 8/1963 | Dawon Kahng. | |
| 3,200,019 | 8/1965 | Scott et al. | 148—188 |
| 3,226,612 | 12/1965 | Haenichen | 317—234 |

JOHN W. HUCKERT, *Primary Examiner.*

R. SANDLER, *Assistant Examiner.*